United States Patent
Baba et al.

(10) Patent No.: US 6,228,165 B1
(45) Date of Patent: May 8, 2001

(54) METHOD OF MANUFACTURING CRYSTAL OF SILICON USING AN ELECTRIC POTENTIAL

(75) Inventors: Masahiko Baba, Vancouver, WA (US); Scott Matthew Kirkland, Portland, OR (US); Richard William Rudberg, Vancouver, WA (US); Susumu Sonokawa, Nishishirakawa-gun (JP); Darren Mark Taie; Akira Uchikawa, both of Vancouver, WA (US)

(73) Assignee: Seh America, Inc., Vancouver, WA (US)

( * ) Notice: Subject to any disclaimer, the term of this patent is extended or adjusted under 35 U.S.C. 154(b) by 0 days.

(21) Appl. No.: 09/362,103

(22) Filed: Jul. 28, 1999

(51) Int. Cl.$^7$ .................................................. C30B 15/16
(52) U.S. Cl. ................................................ 117/29; 117/13
(58) Field of Search ........................................ 117/13, 29

(56) References Cited

U.S. PATENT DOCUMENTS

| | | | |
|---|---|---|---|
| 2,842,467 | * | 7/1958 | Landauer et al. . |
| 4,330,359 | | 5/1982 | Shlichta . |
| 4,548,670 | * | 10/1985 | Pinkhasov . |
| 5,357,898 | | 10/1994 | Kurosawa et al. . |
| 5,723,337 | | 3/1998 | Muller et al. . |
| 5,882,398 | | 3/1999 | Sonokawa et al. . |
| 5,911,826 | | 6/1999 | Hiraishi et al. . |

FOREIGN PATENT DOCUMENTS

| | | |
|---|---|---|
| B-10 47 390 | 12/1958 | (DE) . |
| 0 319 031 A2 | 6/1989 | (EP) . |
| 0 462 741 A2 | 12/1991 | (EP) . |
| 2 198 966 | 6/1988 | (GB) . |
| 62-275087 | 5/1988 | (JP) . |
| WO 86-02919 | 5/1986 | (WO) . |

OTHER PUBLICATIONS

Hoshi, K. et al., "CZ Silicon Crystal Grown in Transverse Magnetic Fields," Extend Abstracts, vol. 80–1, 1980, pp. 811–813.

Hull, E.M., "Controlling the Oxygen Concentration of Silicon Crystals by Magnetically Induced Melt Rotation," IBM Technical Disclosure Bulletin, vol. 23, No. 7A, 1980.

Shimura, Fumio, Semiconductor Silicon Crystal Technology, Academic Press, Inc., San Diego, California, 1988, pp. 178–181.

* cited by examiner

*Primary Examiner*—Felisa Hiteshew
(74) *Attorney, Agent, or Firm*—Oliff & Berridge, PLC

(57) ABSTRACT

A method of manufacturing a crystal of silicon in accordance with a Czochralski method, includes the steps of applying an electric potential across a quartz crucible containing a silicon melt, and pulling a crystal of silicon from the silicon melt.

19 Claims, 7 Drawing Sheets

METHOD OF MANUFACTURING CRYSTAL OF SILICON USING AN ELECTRIC POTENTIAL

BACKGROUND OF THE INVENTION

1. Field of Invention

The present invention relates to a method of manufacturing a crystal of silicon through use of the Czochralski method (CZ method).

2. Description of Related Art

When a crystal of silicon is pulled from silicon melt within a quartz crucible in accordance with the CZ method, the inner surface of the crucible is exposed to the silicon melt, which is maintained at a high temperature. As a result, the condition of the inner surface of the crucible changes and deteriorates. In particular, the vitreous silica changes to a crystalline form, $\beta$-cristobalite. The phase change occurs at many nucleation sites on the inner surface of the crucible. As dissolution of the inner layer occurs, there is potential of undercutting of the $\beta$-cristobalite formations. If the undercutting is severe enough, the formation may be released into the silicon melt. If the $\beta$-cristobalite separates from the inner surface of the crucible and adheres to the surface of a crystal of silicon being pulled, a dislocation may be generated in the crystal.

Especially in manufacture of a crystal of silicon having a diameter equal to or greater than 8 inches, needed to cope with the recent increases in the degree of integration and the degree of accuracy of semiconductor devices, the inner surface of a quartz crucible is exposed to longer operation times and higher temperatures. This leads to increased crucible deterioration and therefore the problem of dislocation generation is apt to occur. In order to manufacture large diameter crystals, much larger crucibles must be used in order to minimize manufacturing costs. For example, in order to manufacture a crystal of silicon having a diameter equal to or greater than 8 inches, a quartz crucible having a large diameter equal to or greater than about 457 mm must be used. In order to melt a large amount of silicon material within such a large-diameter quartz crucible and to maintain the thus-obtained silicon melt, a graphite heater, generally used as a heating element, must be heated to higher temperatures. As a result, the quartz crucible itself is heated to an even higher temperature. The higher the temperature to which the quartz crucible is heated, the higher the possibility of occurrence of deterioration of the inner surface of the crucible that is in contact with the high-temperature silicon melt.

The above-mentioned deterioration of the inner surface of a quartz crucible is generally known to occur in many of the various known CZ pulling methods. For example, deterioration occurs in the multi-pulling method, wherein a silicon material is recharged into the crucible so as to manufacture a plurality of crystals of silicon from the same crucible. See Semiconductor Silicon Crystal Technology, Fumio Shimura, pp. 178–179, 1989. In addition, the described deterioration occurs in the Continuous Czochralski (CCZ) method in which a crystal of silicon is manufactured while a silicon material is continuously being supplied to a crucible. In these methods, the operation time of the quartz crucible becomes longer, so that the inner surface of the quartz crucible deteriorates, resulting in the described generation of dislocations in crystals of silicon. Therefore, for example, in the multi-pulling method, production of a crystal of silicon becomes impossible to continue, and in the CCZ method, production of a crystal of silicon must be stopped part way.

U.S. Pat. No. 5,357,898 to Kirosawa et al., discloses a method of producing a crystal by bringing an electrode in contact with a melt, applying electric current through the melt between the electrode and a metallic container and controlling the current so as to keep it at nearly zero. The intent of the disclosed method is to minimize the electrochemical reaction between the metallic crucible and the melt. The metal container is made mainly of platinum, or a platinum alloy.

U.S. Pat. No. 4,330,359 to Shlichta discloses an electromigration process for the purification of molten silicon during crystal growth. A direct current (DC) power source is provided for applying a current to the silicon melt. The emerging silicon crystal forms the negative electrode while the crucible is preferred as the positive electrode. Applied DC voltages could be on the order of 1 to 10 volts at a current of over 100 amps. At these voltages and currents, resistance heating of the crystal would be expected to occur. It would not be possible to apply this disclosed process to a quartz crucible, commonly used in Czochralski crystal growth, in the electrical circuit. The electrical resistance of the circuit through the crucible would not permit current levels in excess of 100 Amps with a potential of only 1 to 10 Volts. The present inventors estimate that voltages in excess of 80,000 Volts DC would be necessary to achieve current levels over 100 Amps.

Accordingly, there exists a need in the art for a method of manufacturing a crystal of silicon that can reduce the possibility of causing deterioration of the inner surface of a quartz crucible or can restore the deteriorated inner surface of the crucible, thereby making it possible to manufacture a crystal of silicon having a large diameter while reducing the generation of dislocations. Further, in relation to the multi-pulling method, the need exists for a method to manufacture a larger number of crystals of silicon from a single quartz crucible, and in relation to the CCZ method, it has been demanded to operate over a longer period of time using a single quartz crucible, thereby making it possible to manufacture more and/or longer crystals.

SUMMARY OF THE INVENTION

In contrast to the approach taken in U.S. Pat. No. 5,357,898 to Kirosawa et al., described above, the present invention does not rely on stopping the current to prevent an electrochemical reaction, but rather uses the current to improve devitrification.

An object of the present invention is to provide an improved method of manufacturing a crystal of silicon that can reduce or prevent deterioration of the inner surface of a quartz crucible or that can restore the deteriorated inner surface of the crucible, thereby making it possible to manufacture a crystal of silicon having a large diameter while reducing generation of dislocations.

Another object of the present invention is to provide a method for manufacturing a larger number of crystals of silicon from a single quartz crucible, such as by the multi-pulling CZ method.

Still another object of the present invention is to provide a method that allows operation over a longer period of time using a single quartz crucible, thereby making it possible to manufacture a longer crystal, such as by the CCZ method.

The inventors of the present invention found that application of an electric potential to a quartz crucible filled with silicon melt makes deterioration of the inner surface of the quartz crucible unlikely or less likely to occur, and can in embodiments restore the deteriorated inner surface of the crucible.

Although the detailed mechanism of the above phenomenon is not clear, the inventors theorize as follows: When an electric potential is applied to a quartz crucible filled with silicon melt, the quartz crucible's inner layer uniformly devitrifiesto a mostly β-cristobalite surface. The uniform devitrification reduces the occurrence of localized small β-cristobalite formations. Because the β-cristobalite is more resistant to disolution than amorphous quartz, the crucible surface is more resistant to the undercutting and releasing of small crystalline particles. Without the presence of the crystalline particles, the likelihood of producing a dislocation-free crystal is increased. The crucible will not degrade as quickly and will therefore extend the effective batch time.

A method of manufacturing a crystal of silicon according to the present invention comprises the steps of:

a) applying an electric potential to a quartz crucible containing a silicon melt; and b) pulling a crystal of silicon from the silicon melt, so as to obtain a crystal of silicon.

DETAILED DESCRIPTION OF PREFERRED EMBODIMENTS

According to the present invention, an improved crystal growing process is provided that has the advantages of increased throughput and efficiency over the known crystal growing processes. These advantages are provided by applying an electric potential to a quartz crucible, to thereby slow or even reverse deterioration of the quartz crucible. In embodiments of the present invention, the electric potential permits the growth of more silicon crystals, or of longer and/or bigger silicon crystals, from the same quartz crucible prior to the quartz crucible being replaced by a new crucible.

The present invention, in embodiments, is also directed to an apparatus for conducting the disclosed process. In these embodiments, the apparatus generally corresponds to any of the various known crystal growing devices, and further includes a power source for applying an electric potential to a quartz crucible containing a silicon melt.

According to the present invention, a power source is incorporated into the crystal growing (or crystal pulling) device to provide the electric potential. In the present invention, either a variable or a constant power source can be used. However, a variable power source is preferred in embodiments, because it allows for adjustments of the current and/or voltage of the supplied power. Such adjustments can be made at any stage of the process, including between crystals, or even during the growth of a single crystal, as needed.

The power source may include, but is not limited to, a power source that produces from about 1 to about 100 V, preferably 3 to 24 V, more preferably 8 to 12 V, of electric potential. In embodiments of the present invention, the voltages of the power source are generally at a low electric current, for example of from about 0.1 to about 300 mAmp, preferably from about 1 to about 200 mAmp. Of course, as will be apparent to those of ordinary skill in the art, the current and voltage of the power source can be varied inversely proportional to each other (according to Ohm's Law, V=I·R) to provide a desired electric potential in the crystal growing device. Furthermore, voltages and currents outside of the above ranges can be used, so long as the object of the present invention is achieved.

The electric current may be either direct (DC) or alternating (AC) current. In a preferred embodiment of the present invention, a 12 V DC electric potential is applied at a current of about 2 to 15 mAmp.

According to the present invention, the power source can be any suitable power source or circuitry capable of providing the desired electric potential across the quartz crucible. Thus, for example, the power source can include, but is not limited to, a battery, a power supply, an AC/DC or DC/AC converter, a charged capacitor, or the like.

Figure 1:
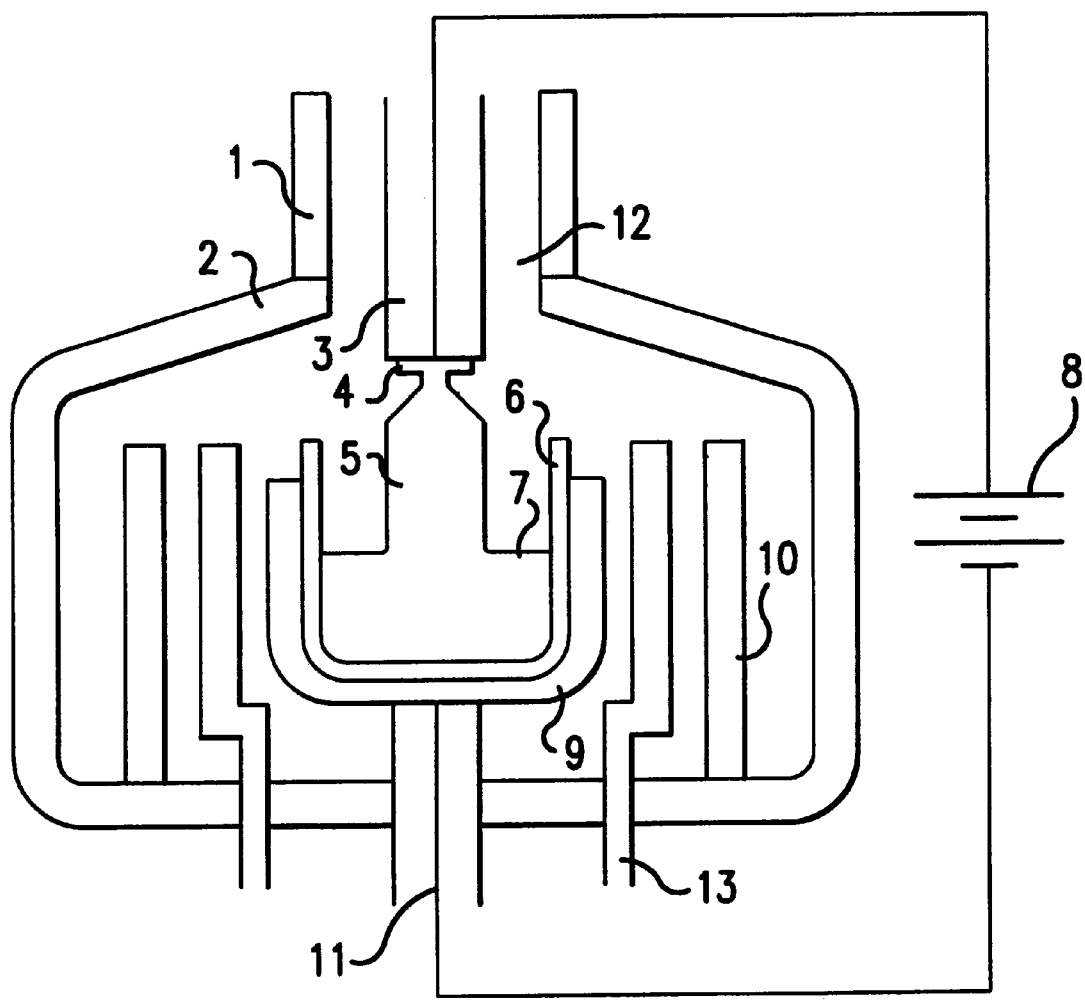
FIG. 1 is a vertical cross-sectional view showing an example of an apparatus that can be used in a method of manufacturing a crystal of silicon in accordance with a CZ method of the present invention.

In embodiments of the present invention, the power source (or electric potential generator) can be a single power source, or any combination of multiple power sources that result in the desired electric potential being applied across the quartz crucible. Thus, for example, although the embodiment shown in FIG. 1 depicts a single power source, such as a battery, any of a variety of equivalent circuits can be utilized without departing from the scope of the present invention. The power source of FIG. 1 is shown schematically in FIG. 4a as a single power source.

Figure 4A:
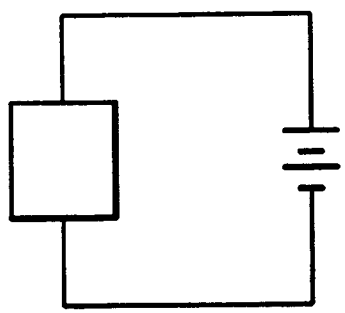
FIGS. 4a–4c are schematic representations of exemplary power sources according to embodiments of the present invention.
Figure 4B:
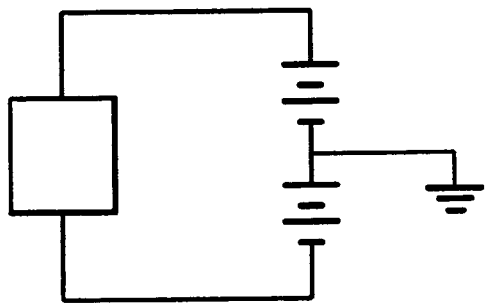

In embodiments, the single power source shown in FIGS. 1 and 4a can be readily replaced by, for example, a system including two power sources, with a common ground. Such an embodiment is shown schematically in FIG. 4b. Numerous other variations will also be readily apparent to those of ordinary skill in the art based on the present disclosure.

Figure 4C:
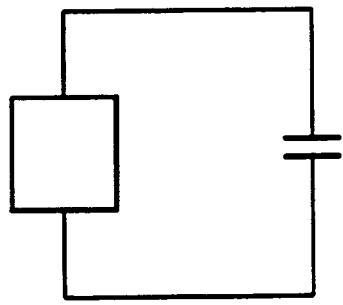
Figure 5A:
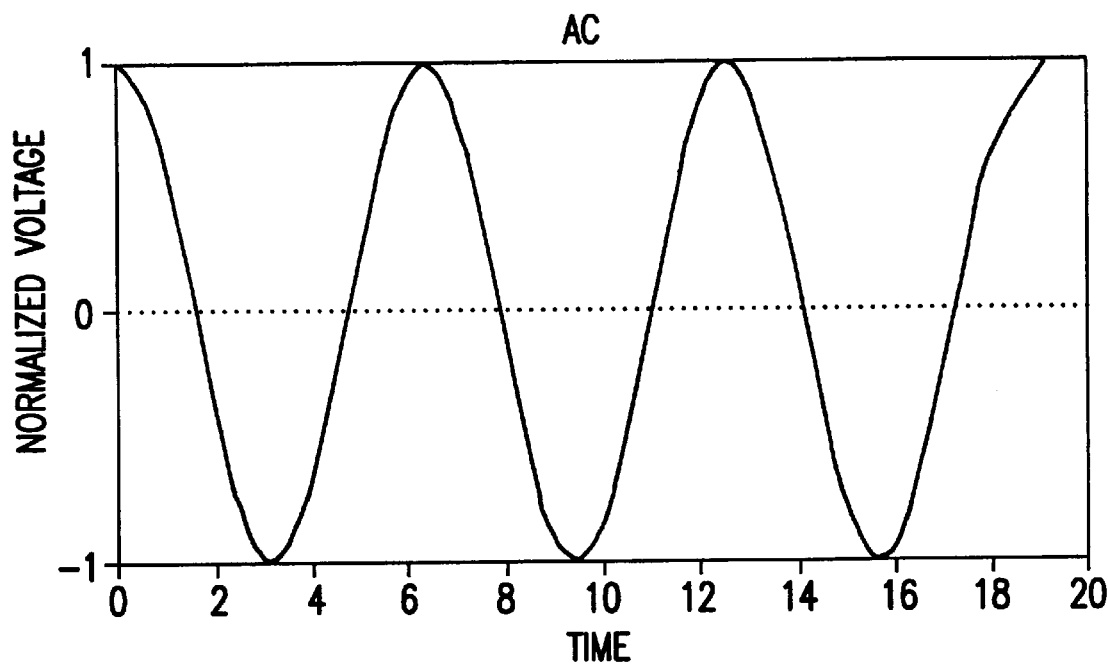
FIGS. 5a–5e are exemplary AC and DC voltage curves according to embodiments of the present invention.
Figure 5B:
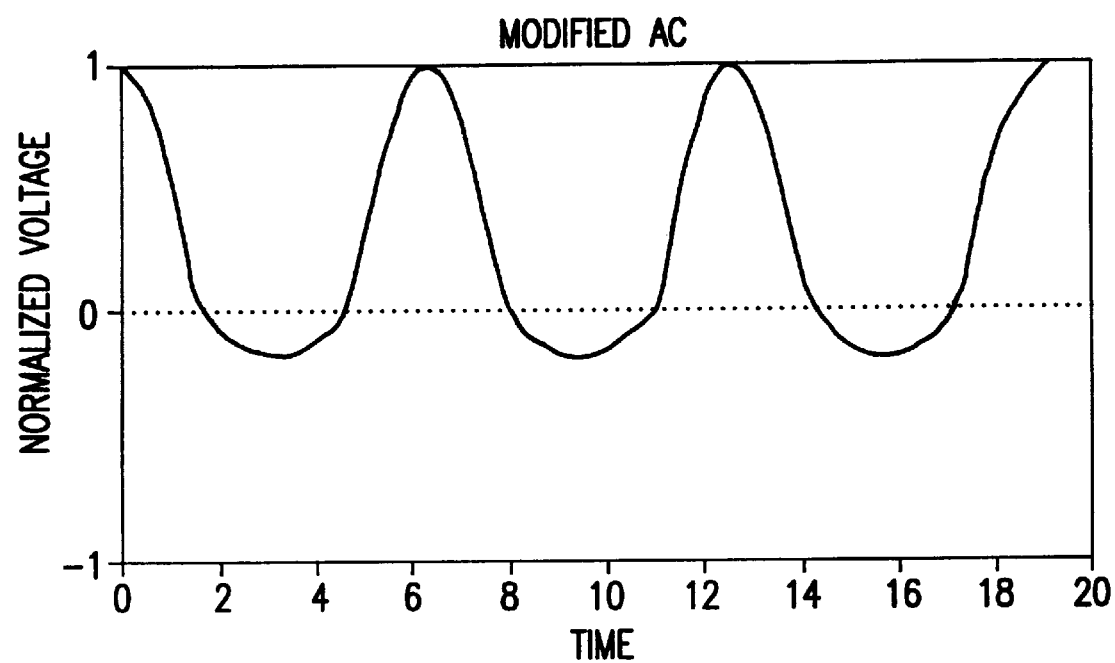
Figure 5C:
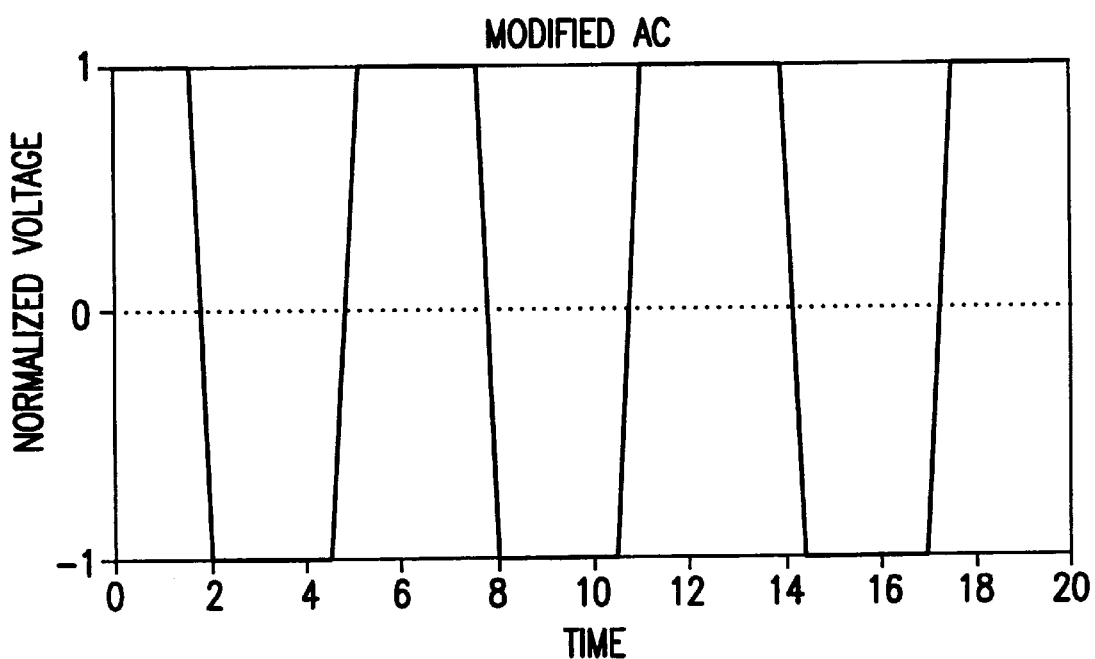
Figure 5D:
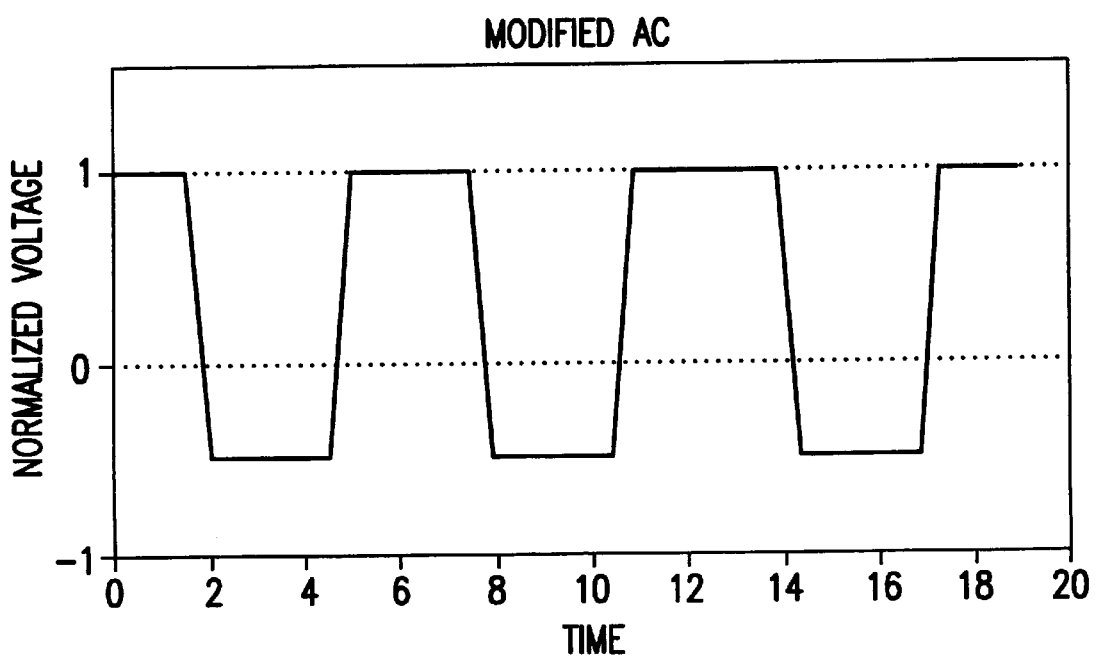
Figure 5E:
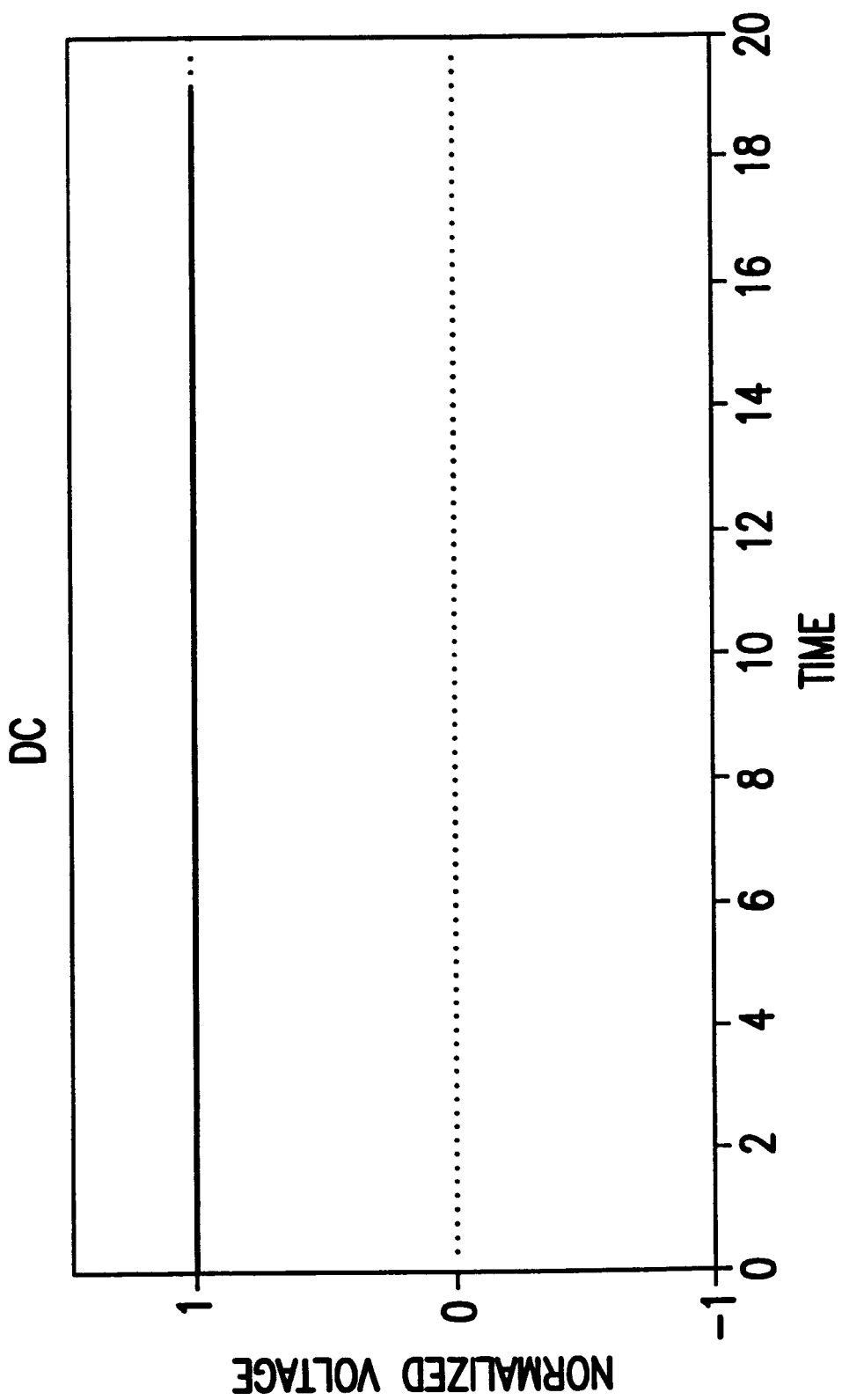

Still further, in embodiments it is possible to completely replace a battery or power supply as the power source with a different component, to achieve the goal of providing a potential different across the silicon melt. For example, in particular embodiments where the circuit applies a high resistance to electric current, it may be unnecessary to utilize a power source to apply the electric potential. Rather, in such embodiments, it may be sufficient to merely provide a charged capacitor as the power source. Although the voltage provided by the capacitor decreases as current flows, the high resistance of the circuit may result in an almost constant electric potential across the quartz crucible with minimal current flow. Such an embodiment is shown schematically in FIG. 4c. Many other variations will be readily apparent to those of ordinary skill in the art.

The negative and positive terminals of the power source are each placed in the crystal growing device so that the electric potential is applied to the device. Preferably, the terminals are placed so that the desired electric potential is applied to the device across the quartz crucible.

In particular, in embodiments of the present invention, one of the negative or positive terminals is placed so that the electric potential is applied to the silicon melt by way of the seed crystal. Thus, for example, the terminal can be attached to the crystal pulling rod or the seed crystal holding device, or to any other component in electrical contact with the seed crystal, such that the power source is operatively connected to the crystal pulling mechanism. The other of the negative or positive terminals is placed so that the electric potential is applied to the silicon melt by way of the quartz crucible. Thus, for example, the terminal can be attached directly to the quartz crucible, can be attached to a graphite or other susceptor or any other device that holds or supports the quartz crucible, or can be attached to any other component in electrical contact with the quartz crucible, such that the power source is also operatively connected to the crucible and/or the crucible holding of support mechanism. Alternatively, the terminals of the power source can be attached in the crystal pulling device so that the electric potential is applied across the silicon melt, without the terminals necessarily being in electrical contact with either the seed crystal holder or the quartz crucible. Various alternatives for attaching the electrical contacts in the device so as to provide the desired electric potential will be apparent to those of ordinary skill in the art based on the present disclosure.

In a preferred embodiment, the negative terminal of the power source is attached to the pulling member of the crystal growing device, and the positive terminal of the power source is attached to a susceptor of the crystal growing device. However, the opposite arrangement (i.e., the positive terminal attached to the pulling member and the negative terminal attached to the susceptor) is also permitted. Furthermore, in the case of using an alternating current power source, the positive and negative terminals will be constantly alternated.

In embodiments of the present invention, it is preferred that the electric potential be applied as a constant potential across the quartz crucible. However, as will be readily apparent to those of ordinary skill in the art, the objectives of the present invention can also be obtained by applying the electric potential in any of numerous waveforms. For example, as shown in FIGS. 5a–5e, a constant electric potential can be readily replaced by a periodic pulsed waveform, where the electric potential is switched, for example, on and off or from a low to a high potential, in a periodic manner. Other variations are also contemplated, and fall within the scope of the present invention.

The electric potential may be applied during any step of the method. In embodiments, the electric potential may be applied before, during or after the pulling of the silicon crystal from the silicon melt. However, in embodiments of the present invention, it is preferred that the electric potential be applied throughout at least a majority (i.e., half) of the crystal pulling process, more preferably throughout the entire crystal pulling process to minimize degradation.

An embodiment of the present invention will now be described in detail with reference to the accompanying drawings.

As shown in FIG. 1, a quartz crucible 6 supported by a graphite susceptor 9 is disposed at the substantial center of a pulling chamber (metal chamber) 2. The graphite susceptor 9 is surrounded by a graphite heater 13, which is in turn surrounded by a heat insulating cylinder 10. The bottom of the susceptor 9 is supported at its center by a support shaft 11 that is rotatable and vertically movable. Provided at the center of the ceiling of the pulling chamber 2 is an opening 12 to which a sub-chamber 1 is connected. A pulling member 3 such as a shaft or a wire that is rotatable and vertically movable is passed through the sub-chamber 1 so that the pulling member 3 extends downward. On the outer side of the pulling chamber 2 is disposed a power source 8 that applies an electric potential to the quartz crucible 6, by way of the graphic susceptor 9, and to the seed crystal 4, by way of the pulling member 3.

When a crystal of silicon is manufactured in accordance with the CCZ method, a crystal is pulled while polycrystalline silicon is supplied as a raw material. Therefore, in such embodiments, the crystal pulling device further includes a means (not shown) for supplying additional raw silicon material to the crucible 6 as the existing raw material in the quartz crucible is used up. Generally, such a supply means can include a supply pipe or any other structure typically used in such a CCZ process.

The CZ method is generally performed as follows:
1) Polycrystalline silicon is charged as a raw material into the quartz crucible 6 and is then heated by the graphite heater 13, whereby the silicon melt 7 is obtained.
2) Subsequently, the pulling member 3 that holds a seed crystal 4 is moved downward so as to immerse the seed crystal 4 into the silicon melt 7.
3) Subsequently, the pulling member 3 is rotated and raised while the support shaft 11 is rotated, whereby a crystal 5 is grown to obtain a crystal of silicon.

According to the CCZ method, as is generally known in the art, the process includes the further step of adding, either intermittently or preferably continuously, additional raw silicon material to the crucible to replenish silicon melt that is being extract in the form of the silicon crystal.

A method of manufacturing a crystal of silicon according to the present invention thus comprises the steps of:
a) applying an electric potential to a quartz crucible containing a silicon melt; and
b) pulling a crystal of silicon from the silicon melt, so as to obtain a crystal of silicon.

As described above, the electric potential is preferably applied throughout at least a majority of the pulling process, and preferably during the entire silicon crystal pulling process to reduce crucible degradation. Thus, in embodiments where the CCZ method is used, the electric potential is preferably maintained from the start of crystal pulling, and can be maintained during the intermittent or continual addition of replenishing raw material, as the silicon crystal is being pulled from the silicon melt in the crucible. In embodiments where the CZ method is used to pull multiple single crystals from the same crucible, the electric potential can either remain on during the time between sequential crystal pulling operations, or it can be turned off during such times.

Of course, as will be apparent to those of ordinary skill in the art, the present invention is not limited to the particular method described above. In particular, the described method can be used in any of the various known or after-developed CZ crystal pulling methods. The present invention can thus be readily applied in any such processes, including the multi-pulling CZ method and the CCZ method, so long as the electrical potential characteristic of the present invention is applied across the quartz crucible in order to reduce crucible degradation.

The present invention, as described generally above, provides significant advantages over the crystal pulling processes and apparatus currently used in the art. In particular, by slowing, preventing, or even reversing deterioration of the quartz crucible, the present invention provides increased throughput at a lower overall cost. That is, because the quartz crucible does not deteriorate, or deteriorates at a slower rate, the same crucible can be used to either pull more crystals (as in the multi-pulling CZ method) or can be used to pull bigger crystals (as in the CCZ method). This benefit provides increased throughput because the crucible need not be changed as often, thereby avoiding resultant process down-time. This benefit also provides economic advantages, in that cost savings can be realized from reduced usage and disposal of quartz crucibles.

The following examples are illustrative of embodiments of the present invention, but are not limiting of the invention. It will be apparent, however, that the invention can be practiced with many different materials and under different operating parameters, and can be used for a variety of different uses in accordance with the disclosure above and as pointed out hereinafter.

EXAMPLE

Example 1

A power source is attached to a pulling member and a graphite susceptor holding a quartz crucible containing polycrystalline silicon as a raw material. A silicon crystal is grown from this raw material, is then re-melted, and then grown again.

Figure 2:
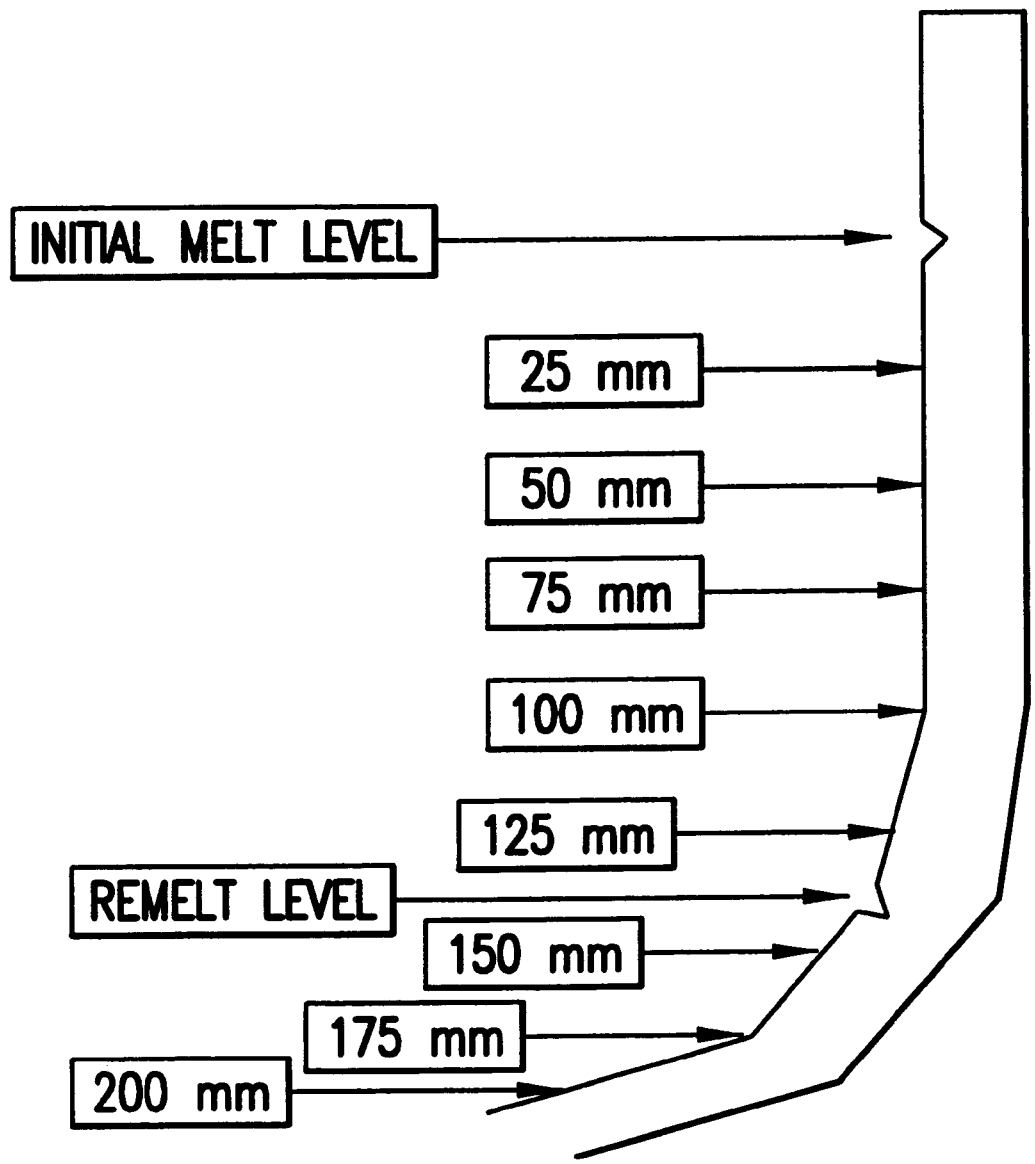
FIG. 2 is a cross-section of a crucible showing how crucible degradation was measured from the initial melt level.

The crystal growing process is repeated several times, varying the voltage and/or the type or polarity of the power source. After each crystal growing operation, crucible degradation is visually measured. In particular, a ruler is used to measure the distance from the initial melt surface to the bottom of the crucible. (This is illustrated in FIG. 2.)

Figure 3:
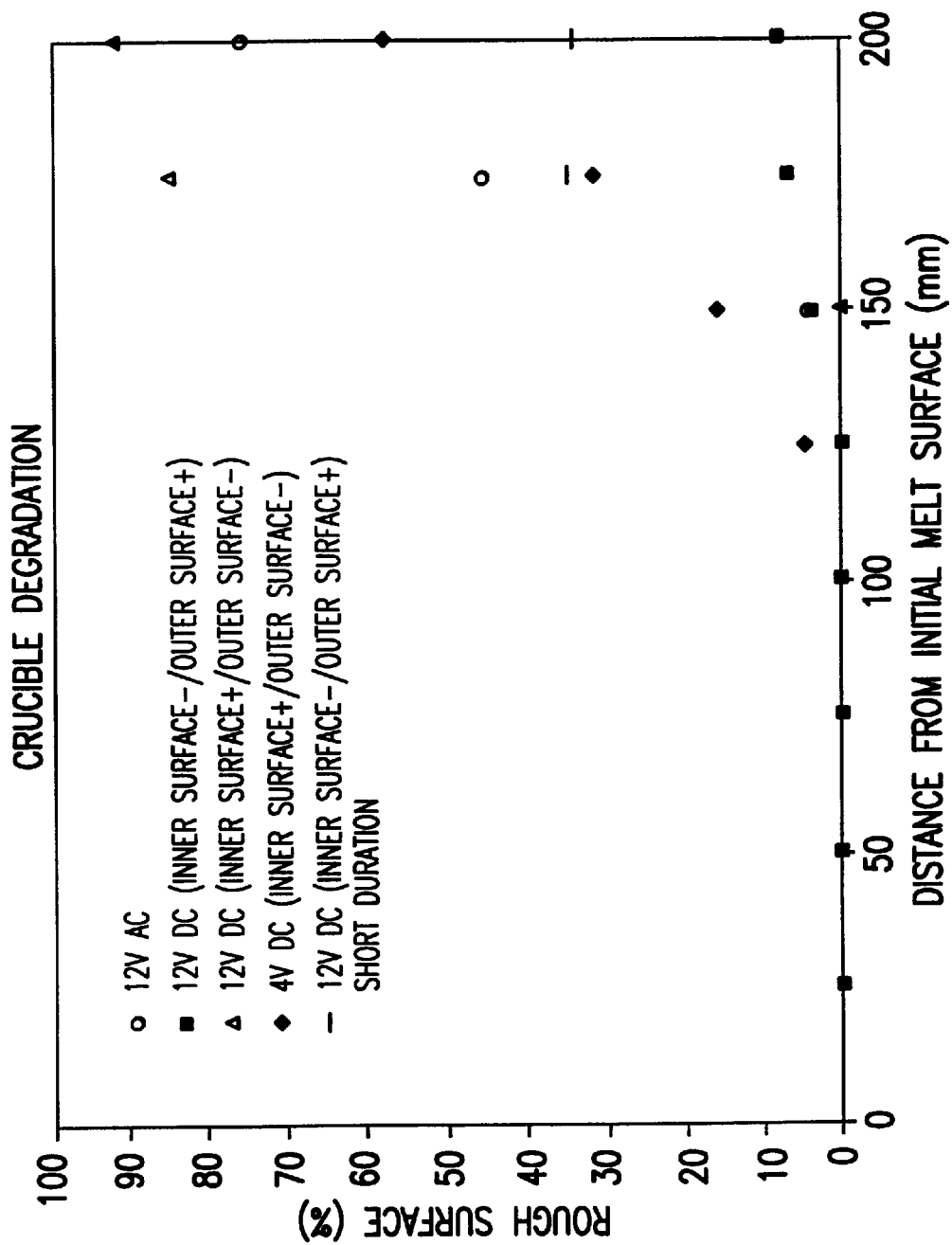
FIG. 3 is a graph showing the effects of varying voltages, current type (alternate or direct), and locations of positive and negative terminals on crucible degradation, as expressed as a relation of rough surface % versus distance from initial melt surface.

The resultant data is presented in the graph in FIG. 3. In FIG. 3, the measurements are graphed with respect to the rough surface % on the vertical axis, and the distance from the initial melt surface (mm) on the horizontal axis.

Based on this testing, it is found that the lowest degradation (rough surface=8%) is found using a 12 V DC power source with the negative terminal attached to the pulling member and the positive terminal attached to the graphite susceptor.

As will be apparent to one of ordinary skill in the art, numerous changes, alterations and adjustments can be made to the above-described embodiments without departing from the scope of the invention, and the invention is in no way limited to the specific exemplary embodiments described above. One skilled in the art will recognize that the various aspects of the invention discussed above may be selected and adjusted as necessary to achieve specific results for a particular application. Thus, the foregoing embodiments are intended to illustrate and not limit the present invention. It will be apparent that various modifications can be made without departing from the spirit and scope of the invention.

What is claimed is:

1. A method of manufacturing a crystal of silicon in accordance with a Czochralski method, comprising the steps of:
   a) applying an electric potential to a quartz crucible containing a silicon melt; and
   b) pulling a crystal of silicon from the silicon melt,
   wherein the electric potential is from about 1 to about 100 volts.

2. The method of claim 1, wherein the electric potential is from about 3 to about 24 volts.

3. The method of claim 1, wherein the electric potential is in the form of a direct current.

4. The method of claim 1, wherein the electric potential is in the form of an alternating current.

5. The method of claim 1, wherein the electric potential is a 12 volt direct current.

6. The method of claim 1, wherein the electric potential is generated by a current of from about 0.1 to about 300 mAmps.

7. The method of claim 1, wherein the electric potential is generated by a current of from about 1 to about 200 mAmps.

8. The method of claim 1, wherein the electric potential is applied by attaching a positive terminal to an outside of said crucible or a holder for said crucible.

9. The method of claim 1, wherein the Czochralski method is a multi-pulling method.

10. The method of claim 1, wherein the Czochralski method is a continuous pulling method.

11. The method of claim 1, wherein the Czochralski method is a single pull method.

12. The method of claim 1, wherein said electric potential is applied from a start of said pulling step to an end of said pulling step.

13. An apparatus for manufacturing a crystal of silicon in accordance with a Czochralski method, comprising:
   a) means for applying an electric potential to a quartz crucible containing a silicon melt; and
   b) means for pulling a crystal of silicon from the silicon melt,
   wherein the electric potential is from about 1 to about 100 volts.

14. A crystal growing apparatus comprising:
   an electric potential generator; and
   a quartz crucible,
   wherein said electric potential generator generates an electric potential across said quartz crucible, and
   wherein the electric potential is from about 1 to about 100 volts.

15. The apparatus of claim 14, wherein said electric potential generator is operatively connected to said quartz crucible to generate said electric potential.

16. The apparatus of claim 14, wherein said electric potential generator is selected from the group consisting of a battery, a power supply, an AC/DC converter, a DC/AC converter, and a capacitor.

17. The apparatus of claim 16, wherein a positive terminal of said electric potential generator is operatively connected to an outside of said quartz crucible.

18. The apparatus of claim 14, said apparatus further comprising a support for said quartz crucible, and said electric potential generator is operatively connected to said support.

19. The apparatus of claim 14, wherein said electric potential is generated by a current of from about 0.1 to about 300 mAmps.

* * * * *